US011253071B2

(12) United States Patent
Mølgaard et al.

(10) Patent No.: US 11,253,071 B2
(45) Date of Patent: Feb. 22, 2022

(54) SHELVING SYSTEM

(71) Applicant: LEGO A/S, Billund (DK)

(72) Inventors: Rikke Høgstrup Mølgaard, Billund (DK); Søren Hansen Hinge, Billund (DK); Søren Holm, Billund (DK)

(73) Assignee: LEGO A/S, Billund (DK)

( * ) Notice: Subject to any disclaimer, the term of this patent is extended or adjusted under 35 U.S.C. 154(b) by 95 days.

(21) Appl. No.: 16/644,086

(22) PCT Filed: Sep. 14, 2018

(86) PCT No.: PCT/EP2018/074921
§ 371 (c)(1),
(2) Date: Mar. 3, 2020

(87) PCT Pub. No.: WO2019/053206
PCT Pub. Date: Mar. 21, 2019

(65) Prior Publication Data
US 2020/0329868 A1    Oct. 22, 2020

(30) Foreign Application Priority Data

Sep. 15, 2017  (DK) ............................. PA 2017 70695

(51) Int. Cl.
*A47B 96/06* (2006.01)
*A47B 96/02* (2006.01)
(Continued)

(52) U.S. Cl.
CPC .......... *A47B 96/066* (2013.01); *A47B 96/021* (2013.01); *H01B 7/04* (2013.01); *H05K 7/14* (2013.01); *A47B 2220/0091* (2013.01)

(58) Field of Classification Search
CPC ... A47B 96/066; A47B 96/021; A47B 96/027; A47B 2220/0091; A47B 2220/0077;
(Continued)

(56) References Cited

U.S. PATENT DOCUMENTS 4,799,133 A     1/1989  Strzalko et al.
5,758,585 A  *  6/1998  Latchinian ........... A47B 96/067
                                                108/108
(Continued)

FOREIGN PATENT DOCUMENTS

DE          200 06 275 U1    8/2001
DE      20 2011 051 645 U1    3/2013
(Continued)

OTHER PUBLICATIONS

First Technical Examination & Search Report issued in Danish priority application No. PA 2017 70695, dated Mar. 19, 2018. (10 pp).

(Continued)

*Primary Examiner* — Stanton L Krycinski
(74) *Attorney, Agent, or Firm* — Day Pitney LLP; Valeriya Svystun

(57) ABSTRACT

A shelving system comprising a mounting surface and at least one shelf unit, the mounting surface comprises a plurality of mounting holes and one or more elongate power supply rails, the at least one shelf unit comprises aback face comprising at least two thru holes adapted for mounting the shelf unit on the mounting surface, the at least one shelf unit comprises power fittings, wherein the shelving system comprises a first power supply bracket and at least one flexible power cable comprising a first and a second end, the at least one flexible power cable is at the first end electrically connected to the first power supply bracket, and the second end of the at least one flexible power cable is electrically connected to the power fittings of the at least one shelf unit, and the first power supply bracket adapted to electrically connect the first end of the at least one flexible power cable and one of the one or more elongate power supply rails, the shelving system adapted to supply power from the elongate (Continued)

power supply rails to electronics connected to the power fittings at or inside the at least one shelf unit.

15 Claims, 3 Drawing Sheets

(51) Int. Cl.
*H01B 7/04* (2006.01)
*H05K 7/14* (2006.01)

(58) Field of Classification Search
CPC .. A47B 57/18; H01B 7/04; H05K 7/14; F21V 33/00; A47F 11/10; A47F 3/001; A47F 5/103
See application file for complete search history.

(56) References Cited

U.S. PATENT DOCUMENTS

| | | | |
|---|---|---|---|
| 6,419,330 B1 | 7/2002 | Lechman | |
| 7,256,346 B2 * | 8/2007 | Walter | A47B 96/14 |
| | | | 174/481 |
| 8,844,211 B2 * | 9/2014 | Pensi | A47B 96/1466 |
| | | | 52/36.6 |
| 8,979,296 B2 | 3/2015 | Wiemer et al. | |
| 9,098,823 B2 * | 8/2015 | Slesinger | A47B 96/021 |
| 9,204,736 B2 * | 12/2015 | Lindblom | A47F 11/10 |
| 9,404,645 B1 * | 8/2016 | Feng | F21V 33/0012 |
| 9,537,274 B1 * | 1/2017 | Dankelmann | A47F 5/0043 |
| 9,578,961 B1 * | 2/2017 | Johnson | A47F 5/0043 |
| 9,775,447 B2 * | 10/2017 | Wiemer | A47F 3/001 |
| 9,831,642 B2 * | 11/2017 | Woodley | A47B 97/00 |
| 9,883,756 B2 * | 2/2018 | Kraiss | A47F 11/10 |
| 10,121,121 B1 * | 11/2018 | De Bonet | A47B 57/34 |
| 10,130,196 B2 * | 11/2018 | Burns | A47F 5/10 |
| 10,278,523 B2 * | 5/2019 | Ringel | A47B 57/34 |
| 10,337,722 B1 * | 7/2019 | Theisen | A47F 5/12 |
| 10,537,191 B2 * | 1/2020 | Ford | F21V 33/006 |
| 2007/0141946 A1 | 6/2007 | Sorensen et al. | |
| 2008/0121146 A1 * | 5/2008 | Burns | A47F 5/101 |
| | | | 108/23 |
| 2012/0228240 A1 * | 9/2012 | Gentile | A47F 5/0823 |
| | | | 211/1 |
| 2012/0230018 A1 | 9/2012 | Wiemer et al. | |
| 2013/0299439 A1 * | 11/2013 | Sid | A47F 11/10 |
| | | | 211/134 |
| 2014/0198490 A1 | 7/2014 | Halseth | |
| 2014/0227893 A1 * | 8/2014 | Howard | A47B 97/00 |
| | | | 439/121 |
| 2014/0370730 A1 | 12/2014 | Flynn et al. | |
| 2015/0201762 A1 * | 7/2015 | Walter | A47F 5/0853 |
| | | | 211/187 |
| 2015/0333490 A1 | 11/2015 | Wessel | |
| 2017/0202372 A1 | 7/2017 | Ringel | |
| 2018/0235383 A1 * | 8/2018 | Josey | A47F 5/0043 |
| 2018/0242761 A1 * | 8/2018 | Jones | A47F 11/10 |
| 2019/0261788 A1 * | 8/2019 | Ringel | A47B 57/10 |
| 2019/0298083 A1 * | 10/2019 | Lee | H01R 25/147 |

FOREIGN PATENT DOCUMENTS

| | | | | |
|---|---|---|---|---|
| EP | 2438836 A1 | 4/2012 | | |
| JP | 2015071027 A | * | 4/2015 | F21K 9/20 |

OTHER PUBLICATIONS

International Search Report and Written Opinion of the International Searching Authority issued in corresponding International application No. PCT/EP2018/074921, dated Oct. 23, 2018. (10 pp).
International Preliminary Report on Patentability, Reply to Written Opinion, and amended sheets of description and claims issued in corresponding international application No. PCT/EP2018/074921, dated Nov. 11, 2019. (31 pp).

* cited by examiner

SHELVING SYSTEM

CROSS-REFERENCE TO RELATED APPLICATIONS

This application is a U.S. National Stage of International Application No. PCT/EP2018/074921, filed on 14 Sep. 2018 and published on 21 Mar. 2019, as WO 2019/053206 A1, which claims the benefit of priority to Danish Patent Application No. DK PA201770695, filed on 15 Sep. 2017. The content of each of the above referenced patent applications is incorporated herein by reference in its entirety for any purpose whatsoever.

The present invention relates to a shelving system comprising a mounting surface and at least one shelf unit, the mounting surface comprises a plurality of mounting holes and one or more elongate power supply rails, the at least one shelf unit comprises a back face comprising at least two mounting holes connectors adapted for mounting the shelf unit on the mounting surface, the at least one shelf unit comprises power fittings.

DESCRIPTION OF RELATED ART

It is well known to have light or other electronic devices built into removable shelves. It is also known to have a shelving system and exhibition wall with modular elements, where shelves are movable either vertically or arbitrarily in the hollow pattern modular wall.

US patent application no. 2007141946 discloses a suspension arrangement (1) comprising a plate (2). The plate is provided with grooves (17) at the bottom of which there are holes (20) and may be used for supporting a shelf support holder (83). At the back side, the plate is provided with mounting fittings (22) that interact with vertical support members (21). The grooves communicate with holes (20) along part of their length. The suspension fittings may hereby be mounted so that they extend through a hole (20) and bear with a first support part against the back side of the plate (2) and a second support part that bears against the bottom of the groove (17).

The arrangement comprises wiring 11 in the panels 9. The wiring 11 is disposed between the wall 3 and the panels 9.

However, in many cases it is desirable to further increase the scope of variations for a modular shelving system.

SUMMARY OF THE INVENTION

It is therefore an object of the invention to increase the variety of options.

This is achieved by the shelving system as described below and as defined in the claims. A shelving system may also be called a shelf system.

This is achieved by the shelving system comprising a first power supply bracket and at least one flexible power cable comprising a first and a second end, the at least one flexible power cable is at the first end electrically connected to the first power supply bracket, and the second end of the at least one flexible power cable is electrically connected to the power fittings of the at least one shelf unit, and the first power supply bracket adapted to electrically connect the first end of the at least one flexible power cable and one of the one or more elongate power supply rails, the shelving system being configured/adapted to supply power from the elongate power supply rails to electronics connected to the power fittings at or inside the at least one shelf unit.

Hereby, is achieved a combination of great flexibility in possible shelf configurations and easy access to power supply for the shelf units. Changes and adjustments in the shelf formation are possible in a simple and easy manner.

The shelving system further may comprise a mounting surface and at least one shelf unit, the mounting surface comprising a plurality of mounting holes and one or more elongate power supply rails, the at least one shelf unit comprising a back face comprising at least two mounting holes connectors configured for mounting the shelf unit on the mounting surface.

In an embodiment, the at least two mounting holes connectors comprises thru holes and fastening means, such as bolts, the at least one shelf unit is adapted to be mounted at the mounting holes on the mounting surface by the fastening means passing through the thru holes and then fastened at the mounting holes.

In an embodiment, the at least one shelf unit comprises a front face, an oblong opening, a detachable front portion and an inner volume, the oblong opening is positioned at the front face, the oblong opening configured/adapted to give access to the inner volume and the at least two thru holes at the back face of the at least one shelf unit, the detachable front portion is arranged or positioned adjacent the front face of the at least one shelf unit, the detachable front portion adapted to cover the oblong opening.

Hereby, is achieved a hidden mounting system and easy alteration of the configurations of shelf units.

In an embodiment, the oblong opening extends in a horizontal direction in use condition, and the detachable front portion comprises a fitting comprising an L-shaped protruding portion adapted to allow the front portion to rest on a side face of the oblong opening at the front face. Hereby is achieved easy access to the inner volume of the shelf units and easy mounting of the front portion.

In an embodiment, the at least one shelf unit comprises a see through panel.

In an embodiment, the mounting holes are positioned uniformly at the mounting surface at grid point of a regular two-dimensional grid, the mounting holes are arranged in vertical columns and horizontal rows.

In an embodiment, the distance between two adjacent mounting holes of the two-dimensional grid is 150 mm both in vertical and horizontal direction.

In an embodiment, the system comprises at least two parallel elongate power supply rails, the distance between the at least two elongate vertically positioned power supply rails corresponds to a distance horizontally between two or more mounting holes.

In an embodiment, the distance between the at least two parallel vertical positioned elongate power supply rails is 750 mm, 900 mm or 1050 mm.

In an embodiment, the power fittings comprise a power rail and a second power supply bracket, the power rail is arranged at the inner volume of the at least one shelf unit, the second power supply bracket adapted to electrically connect the flexible power cable and the power fittings.

In an embodiment, the back face comprises at least one aperture adapted to provide access for the second power supply bracket to the power rail through the at least one thru hole of the back face such that the second power supply bracket can be electrically connected to the power rail.

In an embodiment, the shelving system comprises at least two apertures arranged horizontally in use condition along the length of the back face at a distance between the at least two apertures corresponding to one or more of a distance between two horizontally adjacent mounting holes.

In an embodiment, the back face comprises at least two thru holes arranged horizontally in use condition at a distance between the at least two thru holes, which corresponds to one or more of a distance between two horizontally adjacent mounting holes.

In an embodiment, the back side comprises thru holes arranged horizontally in use condition at a distance corresponding to a distance between two horizontal adjacent mounting holes along the entire length of the back face.

In an embodiment, the at least one shelf unit comprises a plurality of thru holes and apertures, and the true holes and the apertures are arranged alternately between each other in a distance corresponding to half a distance between two horizontal adjacent mounting holes, positioned horizontally, in use condition, along the entire length of the back face.

In an embodiment, the elongate power supply rail extends in a distance corresponding to the height of the mounting surface.

It should be emphasized that the term "comprises/comprising/comprised of" when used in this specification is taken to specify the presence of stated features, integers, steps or components but does not preclude the presence or addition of one or more other features, integers, steps, components or groups thereof.

BRIEF DESCRIPTION OF THE DRAWINGS

In the following, the invention will be described in greater detail with reference to embodiments shown by the enclosed figures. It should be emphasized that the embodiments shown are used for example purposes only and should not be used to limit the scope of the invention.

DETAILED DESCRIPTION OF THE EMBODIMENTS

It is to be noted that the figures and the above description have shown the example embodiments in a simple and schematic manner. The internal electronic, structural and mechanical details have not been shown since the person skilled in the art should be familiar with these details and they would just unnecessarily complicate this description.

The present invention relates to a shelving system 10.

FIGS. 1-5 show different views of an embodiment of a shelving system 10. A shelving system 10 may alternatively be called a shelf system 10.

Figure 1:
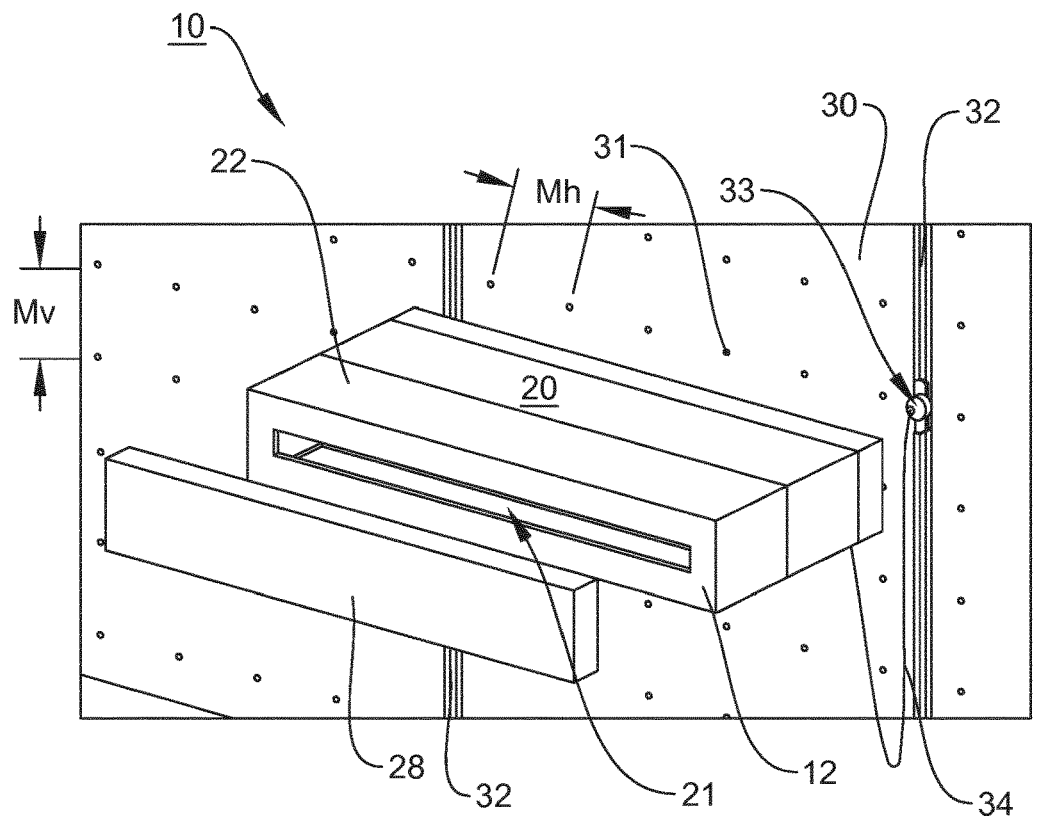
FIG. 1 shows a three dimensional view of a shelving system.

FIG. 1 illustrates a mounting surface 30, such as a wall, comprising a plurality of mounting holes 31. The plurality of mounting holes 31 are positioned in grid points of a regular two-dimensional grid.

The grid points of the regular two-dimensional grid are positioned in horizontal rows and vertical columns comprising a uniform distance between two adjacent mounting holes 31.

In the vertical direction, the mounting holes 31 are arranged in a pattern having a distance between two mounting holes in the vertical direction illustrated by $M_v$ in FIG. 1.

The mounting holes 31 are arranged in a pattern having a distance in horizontal direction illustrated in the figure by $M_h$ in FIG. 1.

Generally, the grid points are arranged in a regular two-dimensional grid having the size $M_v \times M_h$. Preferably, the distance between two mounting holes in the vertical direction, $M_v$, is the same as the distance between two mounting holes in horizontal direction, $M_h$, i.e. $M_v = M_h$.

In a preferred embodiment, the grid points are arranged in a regular two-dimensional grid having the size 150 mm×150 mm. The mounting holes 31 are aligned horizontally and vertically having a distance of 150 mm between two adjacent mounting holes 31, both horizontally and vertically.

The mounting surface 30 may be a wall, such as a wall of a building. The mounting surface may alternatively be a wall element or plate structure configured to be mounted at an existing wall, or provide a cladding of a wall structure in general. Such a wall element or plate structure may comprise part of the shelving system 10.

The mounting surface 30 comprises a vertically positioned elongate power supply rail 32. The elongate power supply rail 32 extends along the entire height of the shelving system 10.

The length of the power supply rails 32 correspond to the vertical height of the mounting surface 30, such that a first power supply bracket 33 can be connected to the power supply rail 32 at any position along the power supply rail 32, and the shelving system 10 is configured/adapted to provide power to a shelf unit 20 at any position on the mounting surface 30. The shelving system 10 comprises one or more power supply rails 32 arranged/positioned in parallel, and configured/adapted to provide power supply to one or more shelf units 20 positioned on any position of the mounting surface 30, thus the entire mounting surface 30 is supplied with power for power fittings or other electronic devices.

One end of a flexible power cable 34 is connected to a first power supply bracket 33, and the first power supply bracket 33 is configured/adapted to be mounted in the power supply rail 32. The other end of the flexible power cable 34 is connected to a power supply shelf bracket 41, which is adapted to be connected to a horizontally arranged power rail 40, positioned inside a shelf unit 20.

Generally, the power supply rails 32 may extend in parallel in horizontal or vertical direction. The power supply rails 32 extend in a distance corresponding to the height or the length of the mounting surface 30. The first power supply bracket 33 and the power supply rails 32 are adapted to connect at any position along the length of the power supply rail 32.

Generally, the distance between the elongate vertically positioned/arranged power supply rails 32 corresponds to a distance, $M_h$, horizontally between two or more mounting holes 31. The distance between the elongate vertically positioned power supply rails 32 is preferably a multiple (integer) of the horizontal distance, $M_h$, between two mounting holes 31. Preferably, and as shown in FIG. 1, the regularly spaced power supply rails 32 are offset a little in the horizontal direction from the mounting holes 31.

In the embodiment shown, the vertically arranged power supply rails 32 are spaced apart in a horizontal distance of 900 mm (6×150 mm). The distance between two parallel vertically positioned elongate power supply rails 32 may be 750 mm, 900 mm or 1050 mm.

The shelf unit 20 comprises a back face (25), which comprises at least two thru holes 26. The thru holes are arranged through a back wall on which the back face 25 is defined.

The back face (25) of the shelf unit 20 comprises at least two mounting hole connectors. A mounting hole connector comprises thru holes 26 and fastening means, such as bolts.

The mounting hole connecters are configured/adapted for mounting the shelf unit 20 on the mounting surface 30.

The shelf unit 20 is adapted to be mounted at the mounting holes 31 on the mounting surface 30 by the fastening means passing through the thru holes 26 and then fastened at the mounting holes 31.

Thus, the distance—in the horizontal direction—between the thru holes 26 is an integer multiple of the vertical distance, Mv, between the mounting holes 31 formed in the mounting surface 30.

The shelf unit 20 comprises a detachable front portion 28 adapted to give access to a front face 12. An oblong opening 21 is provided in the front face 12. The oblong opening 21 is positioned at the front face 12. The oblong opening 21 provides/gives access to an inner volume 11 of the shelf unit 20. The oblong opening 21 is configured/adapted to give access to the inner volume 11 and to thru holes 26 at the back wall/back face 25 of the shelf unit 20. By having access to the inner volume 11 and the thru holes 26, a user is able to mount a shelf unit 20 at the mounting holes 31 on the mounting surface 30 by fastening means passed through the thru holes 26 to the mounting holes 31.

The detachable front portion 28 is adapted to cover the oblong opening 21, when the shelf unit 20 has been positioned juxtaposed the front face 10 of the shelf unit 20.

Figure 2:
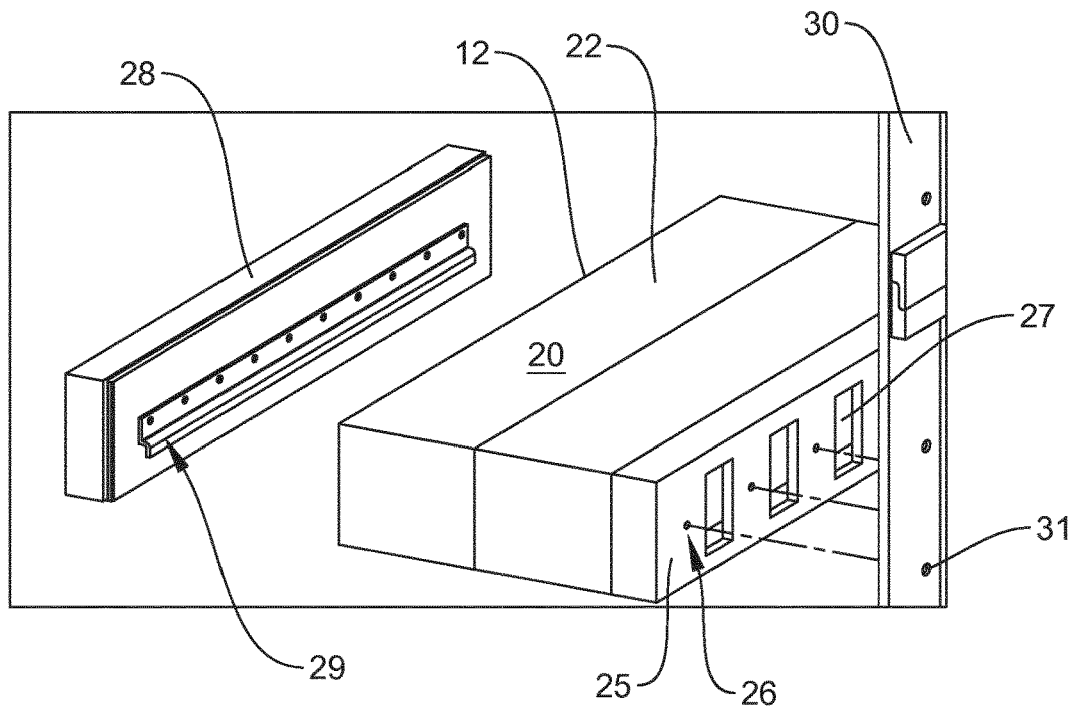
FIG. 2 shows an exploded view of a shelving system.

FIG. 2 illustrates an exploded view of the shelving system.

The shelf unit 20 comprises a front face 12, a top face 22, a bottom face 24, and a back face 25. Each of the top face 22, the bottom face 24, and the back face 25, is defined on a top wall (or top plate), a bottom wall (or bottom plate), and a back wall (or back plate), respectively. The front face 12 comprises the oblong opening 21 providing access to the inner volume 11 of the shelf unit 20. The front portion 28 is configured/adapted to be positioned juxtaposed the front face 12, and to thereby cover the front face 12 and the front face oblong opening 21. The front portion 28 comprises an elongate fitting 29 horizontally arranged on a back face of the front portion 28, and configured/adapted to rest on a side face of the oblong opening 21.

The elongate fitting 29 may comprise an L-shaped protrusion, allowing the front portion 28 to rests on the bottom side of the oblong opening 21, as illustrated in FIG. 2. Other types of connection means for releasable connecting the front portion 28 to the front face 12 may be applied.

As illustrated in FIG. 1, the oblong opening 21 extends in a horizontal direction in use condition. The detachable front portion 28 comprises a fitting 29 comprising an L-shaped protruding portion adapted to allow the front portion 28 to rest on a side face of the oblong opening 21 at the front face 10.

The back face 25 of the shelf unit 20 comprises several thru holes 26 arranged along the length of the back face 25. A plane defined by the surface of the back face 25 extends in the horizontal direction, in use condition, along the length of the back face 25. The length of the back face 25 is defined by the extent of the back face in horizontal direction in use condition of the shelf unit 20.

In between the several thru holes 26 several apertures 27 are arranged. The apertures 27 are rectangular in shape, and are much larger than the thru holes 26. Like the thru holes 26, the apertures 27 extend all the way through the back wall (back plate) defining the back face 25. Thereby, the apertures 27 provide windows through which a user may be provided access to the inner volume 11 of the shelf unit 20 through the back face 25.

When the shelf unit 20 is to be mounted on a mounting surface 30, the thru holes 26 face the mounting surface 30, and are aligned with the mounting holes 31. The shelf unit 20 is mounted on the mounting surface 30 by fastening means, such as a bolt. The fastening means are extended through the front face 12 oblong opening 21, which gives access to the inner volume 11 of the shelf unit 20, and thereby to the thru holes 26. Thus, the fastening means are extended through the oblong opening 21 and the inner volume 11 to the back wall (back plate), and are inserted into the thru holes 26, and are extended there through and inserted into the mounting holes 31 in the mounting surface 30. Hereby, it is possible to fasten or unfasten a shelf unit 20 and remount the shelf unit 20 to alter the position of the shelf unit 20.

Figure 3:
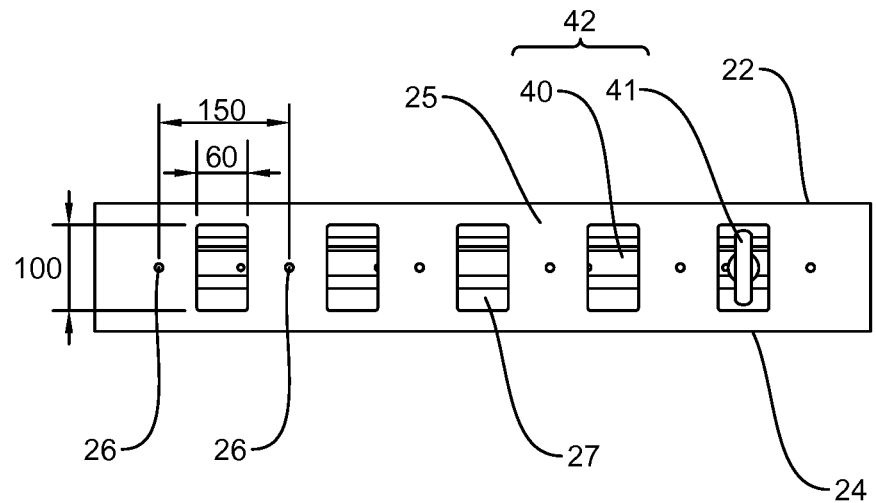
FIG. 3 shows an end view of a shelf.

The back face 25 of the shelf unit 20 is shown in FIG. 3. The back face 25 may—as shown in FIG. 3—comprise power fittings 42. The power fittings 42 comprises an oblong power rail 40, and a second power supply bracket 41, the power rail 40 is arranged in the inner volume 11 of the shelf unit, and preferably in connection with the back wall (back plate) defining the back face 25. The second power supply bracket 41 is adapted to electrically connect the flexible power cable 34 and the power fittings 42.

In an embodiment, and as shown in FIG. 3, the shelf unit 20 comprises a top face 22 and a bottom face 24. The back face 25 comprises six thru holes 26 and five apertures 27, where the apertures 27 are positioned between respective pairs of thru holes 26, such that the thru holes 26 and the apertures 27 form an alternating sequence at the back face 25. The shelf thru holes 26 are positioned/arranged in a horizontal row, and at a distance of 150 mm between the thru holes 26.

In this embodiment, the apertures 27 comprise a rectangular shape having a length of 60 mm and a height of 100 mm. The apertures 27 give/provide access for a power supply bracket 41 to electrically connect a power rail 40, at the rear face of the back face 25, positioned at the inner volume 11 of the shelf unit 20. A power supply bracket 41 is placed at the power rail 40 through one of the apertures 27.

In general the apertures 27 is sized to allow passage of the power supply brackets 41.

The power rail 40 is arranged inside the inner volume 11 of the shelf unit 20. The oblong power rail 40 extends along the length of the shelf unit 20 to such effect that each of the apertures 27 provides access to the power rail 40, such that a power supply bracket 41 can connect to the power rail 40.

The back face 25 comprises at least one aperture 27 adapted to provide access for the second power supply bracket 41 through the back face 25, such that the power supply bracket 41 can be electrically connected to the power rail 40.

The shelf thru holes 26 are arranged at a distance between them of 150 mm, which corresponds to the distance horizontally between the mounting holes 31.

In general, the distance between two adjacent shelf mounting holes/thru holes 26 corresponds to the distance between two adjacent horizontally arranged wall mounting holes 31 positioned at grid points of a regular two-dimensional grid. Thereby, a shelf unit 20 can be placed at any position within the mounting surface 30 comprising mounting holes 31.

The flexible power cable 34 comprises two ends. One end of the flexible power cable 34 is connected to the first power supply wall bracket 33. The first power supply bracket 33 is adapted/configured to be mounted in the power supply rail 32. The other end of the flexible power cable 34 is connected to the power supply bracket 41, which is adapted/configured to be connected to a horizontal power supply rail 40 positioned inside a shelf unit 20.

Figure 4:
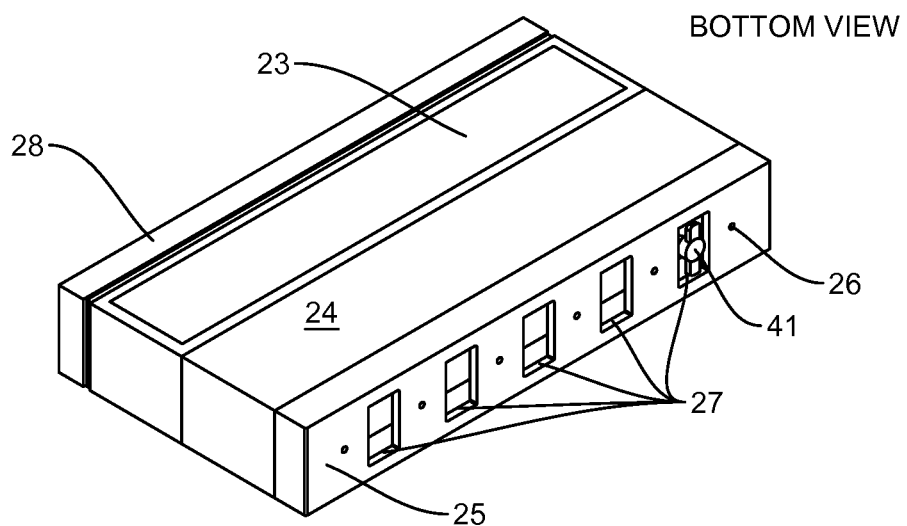
FIG. 4 shows a three dimensional bottom view of a shelf.

The shelf unit 20 shown in FIG. 3, is illustrated in a perspective or three dimensional bottom view in FIG. 4. The back face 25 comprises five apertures 27. A power supply bracket 41 is arranged within one of the apertures to connect to the power rail 40.

The bottom face 24, shown in FIG. 4, comprises a see through panel 23. A light source may be arranged within the inner volume 11 of the shelf unit 20 and shine through the see through panel 23. A built in light source or other electronic devices can be powered by power fittings 42. The power fittings 42 comprise power supply rails 40 and power supply brackets 41.

FIG. 4 shows a shelf unit 20 in a three dimensional (perspective) bottom view.

The shelving system 10 comprises at least one shelf unit 20. In the shown embodiment, the shelf unit 20 comprises a see through panel 23, which is arranged/positioned at the bottom face 24 of the shelf unit 20.

The shelf unit 20 comprises several apertures 27 arranged horizontally in use condition along the length of the back face 25 and with a distance between the apertures 27, which correspond to one or more of a distance between two horizontally adjacent mounting holes 31.

The back side 25 comprises two or more thru holes 26 arranged horizontally in use condition, and with a distance corresponding to a distance between two horizontal adjacent mounting holes 31 between them along the entire length of the back face 25.

In the shown embodiment, the plurality of thru holes 26 and apertures 27 are arranged alternately between each other in a distance of half a distance between the mounting holes. The thru holes 26 and the apertures 27 are positioned horizontally in use condition along the entire length of the back face 25.

The shelf unit 20 has a length of 900 mm (6×150 mm). The shelf unit 20 extends from one power supply rail 32 to an adjacent power supply rail (shown in FIG. 1). The shelf unit 20 may be positioned between two power supply rails 32. Generally, the one or more shelf units 20 of the shelving system 10 may be mounted at any position on the mounting surface 30.

In an embodiment, the back face 25 comprises at least two thru holes 26 arranged horizontally in use condition at a distance between the at least two thru holes 26, which corresponds to one or more of a distance between two horizontally adjacent mounting holes 31. Hereby, the thru holes 26 will be positioned juxtaposed mounting holes 31, when a shelf unit 20 is mounted on the mounting surface 30.

Figure 5:
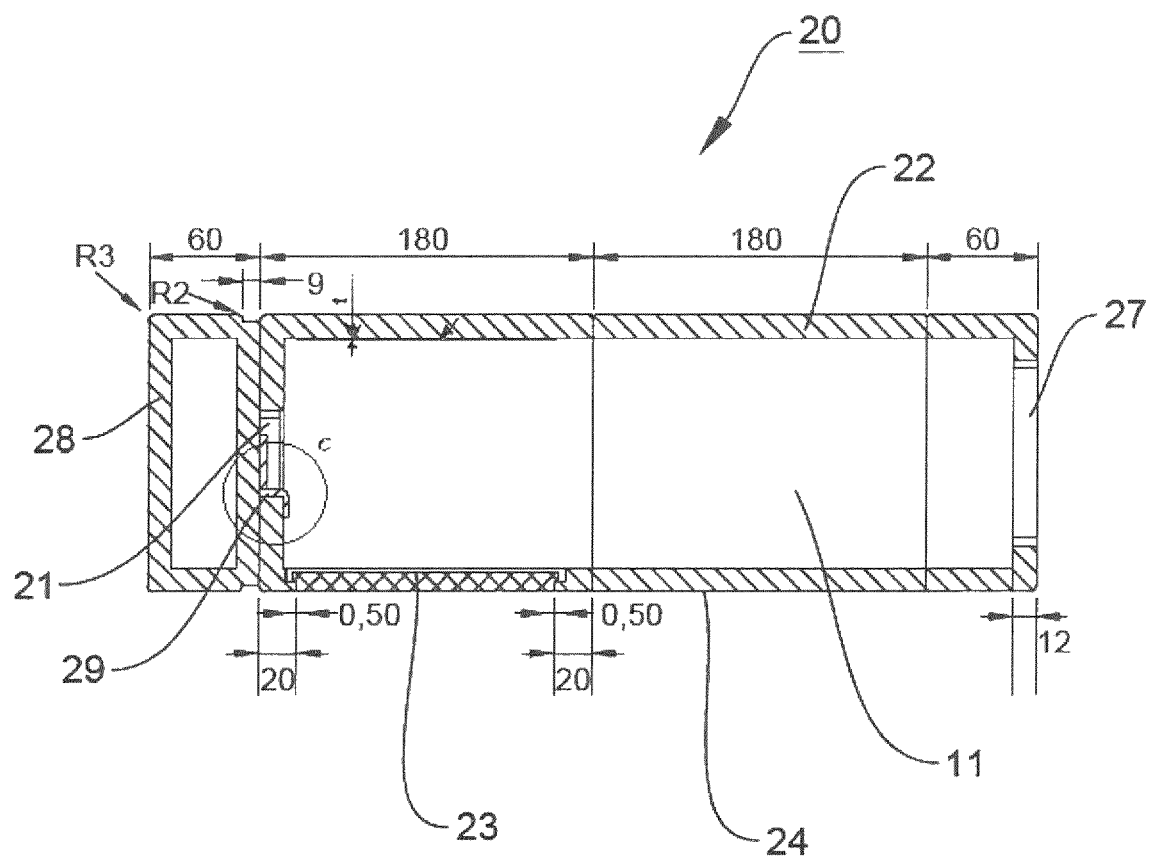
FIG. 5 shows a cross sectional side view.

FIG. 5 shows a cross sectional side view of the shelf unit 20 illustrated in FIGS. 3 and 4. FIG. 5 shows that the shelf unit 20 comprises a top face 22 and a bottom face 24. The see through panel 23 is positioned at the bottom face 24 juxtaposed the front face and the front portion 28. The elongate fitting 29 comprises an L-shaped protrusion, which rests on the bottom side of the oblong opening 21.

The inner volume 11 is accessed by the oblong opening 21 at the front face 12 of the shelf unit 20 and through the aperture 27 at the back of the shelf unit 20.

A shelf unit 20 is mounted on the mounting surface by

Electrically connecting power supply brackets 33 and power supply rails 32 at a location near the position for the shelf unit 20 to be mounted, such that the power supply rail 32, the first power supply power bracket 33 and the flexible power cable 34 are electrically connected to the power fittings 42 of the shelf unit 20, Positioning the shelf unit 20 at the mounting position, Fastening the fastening means, such as bolts, from the inner volume 11 through the thru holes 26 to mounting holes 31 on the mounting surface 30, Positioning the front portion 28 juxtaposed the front face 12 to cover the oblong opening 21.

At any time it is possible to change the configuration of the one or more shelf units 20 on the mounting surface 30.

The invention relates to a shelving system 10 comprising a mounting surface 30 and at least one shelf unit 20, the mounting surface 30 comprises a plurality of mounting holes 31 and one or more elongate power supply rails 32, the at least one shelf unit 20 comprises a back face 25 comprising at least two thru holes 26 adapted for mounting the shelf unit 20 at the mounting holes 31 on the mounting surface 30, the at least one shelf unit 20 comprises power fittings 42, wherein the shelving system 10 comprises a first power supply bracket 33 and at least one flexible power cable 34 comprising a first and a second end, the at least one flexible power cable 34 is at the first end electrically connected to the first power supply bracket 33, and the second end of the at least one flexible power cable 34 is electrically connected to the power fittings 42 of the at least one shelf unit 20, and the first power supply bracket 33 is adapted to electrically connect the first end of the at least one flexible power cable 34 and one of the one or more elongate power supply rails 32, the shelving system 10 is adapted to supply power from the elongate power supply rails 32 to electronics connected to the power fittings 42 at or inside the at least one shelf unit.

The invention claimed is:

1. A shelving system comprising:

a mounting surface and at least one shelf unit, the mounting surface comprising a plurality of mounting holes and one or more elongate power supply rails;

the at least one shelf unit comprising a top face defined on a top wall of the shelf unit, a bottom face defined on a bottom wall of the shelf unit, and a back face defined on a back wall of the shelf unit, the back face comprising at least two mounting hole connectors configured for mounting the shelf unit on the mounting surface, the at least two mounting hole connectors comprising thru holes through the back wall with the back face, and the at least one shelf unit comprising power fittings;

wherein the shelving system comprises a first power supply bracket and at least one flexible power cable comprising a first and a second end, where the at least one flexible power cable is at the first end electrically connected to the first power supply bracket, and the second end of the at least one flexible power cable is electrically connected to the power fittings of the at least one shelf unit, and the first power supply bracket is configured to electrically connect the first end of the at least one flexible power cable and one of the one or more elongate power supply rails, and where the shelving system is configured to supply power from the elongate power supply rails to electronics connected to the power fittings at or inside the at least one shelf unit;

wherein the at least one shelf unit comprises a front face, an oblong opening arranged at the front face, a detachable front portion configured to be positioned juxtaposed the front face to cover the front face, and an inner volume, the oblong opening providing access to the inner volume and the thru holes, where the detachable front portion is arranged at the front face and is configured to cover the oblong opening, and where the front portion comprises an elongate fitting horizontally arranged on a back face of the front portion, and configured to rest on a side face of the oblong opening.

2. The shelving system according to claim 1, wherein the at least two mounting hole connectors comprise fasteners, such as bolts, wherein the at least one shelf unit is configured to be mounted at the mounting holes on the mounting surface by the fasteners passing through the thru holes and then fastened at the mounting holes.

3. The shelving system according to claim 1, wherein the oblong opening extends in a horizontal direction, and the detachable front portion comprises a fitting comprising an L-shaped protruding portion adapted to allow the front portion to rest on a side face of the oblong opening at the front face.

4. The shelving system according to claim 1, wherein the at least one shelf unit comprises a see through panel.

5. The shelving system according to claim 1, wherein the mounting holes are positioned uniformly at the mounting surface at grid points of a regular two-dimensional grid, and wherein the mounting holes are arranged in vertical columns and horizontal rows.

6. The shelving system according to claim 5, wherein the distance between two adjacent mounting holes of the two-dimensional grid is 150 mm both in the vertical and horizontal direction.

7. The shelving system according to claim 1, further comprising at least two parallel vertically positioned elongate power supply rails, the distance between the at least two parallel vertically positioned elongate power supply rails corresponding to a distance horizontally between two or more mounting holes of the plurality of mounting holes.

8. The shelving system according to claim 7, wherein the distance between the at least two parallel vertically positioned elongate power supply rails is 750 mm, 900 mm or 1050 mm.

9. The shelving system according to claim 1, wherein the power fittings comprise a power rail and a second power supply bracket, wherein the power rail is arranged at the inner volume of the at least one shelf unit, and wherein the second power supply bracket is configured to electrically connect the flexible power cable and the power rail.

10. The shelving system according to claim 9, wherein the back face comprises at least one aperture adapted to provide access for the second power supply bracket through the back face to be electrically connected to the power rail.

11. The shelving system according to claim 1, further comprising at least two apertures arranged horizontally along the length of the back face, wherein a distance between the at least two apertures corresponds to one or more of a distance between two horizontally adjacent mounting holes of the plurality of mounting holes.

12. The shelving system according to claim 1, wherein the thru holes are arranged horizontally on the back face at a distance corresponding to one or more of a distance between two horizontally adjacent mounting holes of the plurality of mounting holes.

13. The shelving system according to claim 1, wherein the thru holes are arranged horizontally on the back face at a distance corresponding to a distance between two horizontal adjacent mounting holes of the plurality of mounting holes along the entire length of the back face.

14. The shelving system according to claim 1, wherein the at least one shelf unit comprises a plurality of apertures, wherein the thru holes and the plurality of apertures are arranged alternately between each other at a distance corresponding to half a distance between two horizontal adjacent mounting holes of the plurality of mounting holes, and arranged horizontally along the entire length of the back face.

15. The shelving system according to claim 1, wherein the one or more elongate power supply rails extend in a distance corresponding to the height of the mounting surface.

* * * * *